United States Patent
Ben-Yaakov

(10) Patent No.: US 6,747,391 B1
(45) Date of Patent: Jun. 8, 2004

(54) DRIVER FOR PIEZOELECTRIC MOTORS

(75) Inventor: Shmuel Ben-Yaakov, Beer-Sheva (IL)

(73) Assignee: Nanomotion Ltd., Yokneam (IL)

(*) Notice: Subject to any disclaimer, the term of this patent is extended or adjusted under 35 U.S.C. 154(b) by 0 days.

(21) Appl. No.: 09/830,374

(22) PCT Filed: Oct. 25, 1998

(86) PCT No.: PCT/IL98/00519

§ 371 (c)(1),
(2), (4) Date: Apr. 24, 2001

(87) PCT Pub. No.: WO00/25368

PCT Pub. Date: May 4, 2000

(51) Int. Cl.[7] ............................................. H01L 41/04
(52) U.S. Cl. ................................................. 310/316.01
(58) Field of Search ....................... 310/316.01–316.02, 310/317, 323.03; H01L 41/04

(56) References Cited

U.S. PATENT DOCUMENTS

| | | | |
|---|---|---|---|
| 5,021,725 A | | 6/1991 | Jimbo et al. |
| 5,130,619 A | | 7/1992 | Izuno |
| 5,214,339 A | | 5/1993 | Naito |
| 5,438,229 A | | 8/1995 | Ohtsuchi et al. |
| 5,453,653 A | | 9/1995 | Zumeris |
| 5,461,273 A | | 10/1995 | Kawasaki et al. |
| 5,475,288 A | | 12/1995 | Furukoshi |
| 5,500,565 A | * | 3/1996 | Okubo .................. 310/316.02 |
| 5,563,464 A | * | 10/1996 | Okubu et al. .......... 310/316.02 |
| 5,563,478 A | | 10/1996 | Suganuma |
| 5,625,246 A | | 4/1997 | Suganuma |
| 5,640,063 A | * | 6/1997 | Zumeris et al. .............. 310/328 |
| 5,644,199 A | * | 7/1997 | Nojima et al. ............... 318/114 |
| 5,714,833 A | | 2/1998 | Zumeris |
| 5,777,423 A | | 7/1998 | Zumeris |
| 5,834,864 A | | 11/1998 | Hesterman et al. |
| 5,998,899 A | | 12/1999 | Rosen et al. |
| 6,661,153 B1 | * | 12/2003 | Shiv et al. ............. 310/316.01 |

FOREIGN PATENT DOCUMENTS

EP    0 712 170    5/1996

OTHER PUBLICATIONS

Ikeda, T.; "Fundamentals of Piezoelectricity;" Oxford University Press; 1990; pp. 94–97.

Edry, D. et al.; "Capacitive–Loaded Push–Pull Parallel–Resonant Converter," IEEE Transactions on Aerospace and Electronic Systems; vol. 29; No. 4; Oct. 1993; pp. 1287–1296.

Gulko, M. et al.; "Current–Sourcing Push–Pull Parallel–Resonance Inverter (CS–PPR1): Theory and Application as a Discharge Lamp Driver;" IEEE Transactions on Industrial Electronics, vol. 41, No. 3; Jun. 1994; pp. 285–291.

(List continued on next page.)

Primary Examiner—Thomas M. Dougherty
Assistant Examiner—Karen Addison
(74) Attorney, Agent, or Firm—Fenster & Company

(57) ABSTRACT

A micromotor comprising: a piezoelectric element including a common electrode and a plurality of other electrodes formed thereon and including at least a first a and a second electrode group, each group including at least one electrode, wherein the piezoelectric element causes motion in a first direction when a voltage is applied between the first electrode group and the common electrode, and wherein the piezoelectric element causes motion in a second direction when a voltage is applied between the second electrode group and the common electrode; a voltage source that electrifies the common electrode; and at least two switches separately connected between the first and second electrode groups and a low voltage, said switches being activatable to connect one of said first and second electrode groups to the low voltage to cause selective motion in the first or second directions.

20 Claims, 7 Drawing Sheets

OTHER PUBLICATIONS

Ivensky, G. et al; "Current–Bed Multiresonant Isolated DC–DC Converter;" IEEE Transactions on Aerospace and Electronic Systems; vol. 33; No. 1; Jan. 1997; pp. 53–63.

Ivensky, G. et al.; "Current–Fad Multi–Resonant DC–DC Converters;" IEEE Applied Power Electronics Conference (APEC '93) Record; Mar. 1993; pp. 58–64.

Gulko, M. et al.; "Current–Sourcing Push–Pull Parallel–Resonance Inverter (CS–PPRI): Theory and Application as a Fluorescent Lamp Driver;" IEEE Applied Power Electronics Conference (APEC '93) Record; Mar. 1993; pp. 411–417.

Gulko, M. et al.; "Inductor–Controlled Current–Sourcing Resonant Inverter and its Application as a High Pressure Discharge Lamp Driver;" IEEE Applied Power Electronics Conference (APEC–'94); 1994; pp. 434–440.

Edry, D. et al.; "Dynamics of the Capacitive–Loaded Push–Pull Parallel–Resonant Converter: Investigation by A SPIC Compatible Average Model;" IEEE Applied Power Electronics Conference (APEC'–94); 1994; pp. 1035–1041.

Ben–Yaakov, S. et al.; "The Simplest Electronic Ballast for HID Lamps;" IEEE Applied Power Electronics Conferen APEC–96; pp. 634–640.

Gulko, M. et al.; "A MHz Electronic Ballast for Automotive–Type HID Lamps"; PRSC–'97; 1997; pp. 39–45.

Collins, R. A.; "The Giant Handbook of Electronic Circuits;" Tab Books Inc.; 1980; pp. 174–177.

* cited by examiner

DRIVER FOR PIEZOELECTRIC MOTORS

RELATED APPLICATIONS

The present application is a U.S. national application of PCT/IL98/00519, filed 25 Oct. 1998.

FIELD OF THE INVENTION

The present invention relates to systems for driving piezoelectric actuators and piezoelectric motors and more particularly to the electronic circuitry of such drivers.

BACKGROUND OF THE INVENTION

Piezoelectric materials are characterized in that when they are subjected to electrical fields they can be made to deflect; i.e., produce mechanical motion. Also when mechanical stress is applied to piezoelectric elements so hat they undergo displacement they generate electrical signals. These characteristics are the reason that piezoelectric materials are useful in applications ranging from sensors to mechanical motors. Examples of piezoelectric elements being used as motors is shown for example in U.S. Pat. Nos. 5,714,833 and 5,777,423; which patents are assigned to the assignee of the invention of this application. Piezoelectric motors are characterized by their mechanical simplicity. They have very few parts, no separate moving parts, and there are no critical mechanical components such as gears, shafts, bearings etc. Consequently, piezoelectric motors are relatively inexpensive and highly reliable.

A piezoelectric element represents an electrical reactive load (mainly capacative) that requires an AC signal of substantial voltage amplitude to cause the mechanical displacement. The required voltage amplitude is generally in the range of a few hundred volts (RMS). For effectively operating the piezoelectric element as a motor or actuator a drive circuit applies voltage thereto of a specific frequency with low harmonic distortion. For the best results, i.e. maximum displacement, the specific frequency should equal the mechanical resonant frequency of the piezoelectric element. A simplified circuit that could be used to drive a piezoelectric motor is shown in FIG. 1A, while such a motor is illustrated in FIG. 1B. This method required two sources and two matching (high-Q) resonant circuits (not shown).

A preferred manner of actuating bidirectional operation of the piezoelectric element provides one side of the element with a pair of electrodes that are connected to a voltage source, such as a switch mode inverter. An opposite side of the piezoelectric element has a single common electrode. The common electrode is grounded or connected to ground by passive or active elements so that current from each of the pair of electrodes flows in opposite directions to cause bidirectional displacement of the piezoelectric element.

The drive circuits for piezoelectric motors basically provide AC voltages to the electrodes according to the directional movement required or desired. Typical prior art drive circuits for actuating the piezoelectric elements to provide movement in a selected direction or selected directions comprise separate inverter circuits coupled to the piezoelectric element through resonant circuitry attached to each of the elements high side electrodes. The prior art utilizes such multiple inverters to cause directional motion of the piezoelectric motors without any separate switching units. Other prior art devices utilize a single high voltage source and switching circuitry to switch the source between different electrodes. This methodology requires high voltage capable switching circuitry.

A major disadvantage of the prior art drivers is the complexity of the circuitry that is used. For example, a commonly used driver comprises a bridge type inverter circuit (see FIG. 2) that requires six power switches, and two high Q resonant circuits. Other prior art drivers require only one high Q resonant circuit The reduction in the number of high Q resonant circuits is accomplished by placing the high Q resonant circuit in series with the common electrode. However, six power switches are still used in that prior art device (see EP 0712 170 A1), which application is assigned to the assignee of this application. In FIG. 7 of that device, four switches are used for displacement directional control with two switches for each of the selectable directions. The high Q resonant circuits are sensitive to the accuracy of the circuit component and to the frequency of the applied voltage. As a practical solution for overcoming this sensitively, in the prior art the Q of the drivers was often lowered and the input voltage from the prior art drivers was raised Extra DC/DC converters were required to enable operation with lower input voltages. Consequently, in the prior art, while the piezoelectric motors are simple the driver circuitry has until now been complex, especially when driving piezoelectric motors in two directions.

SUMMARY OF THE INVENTION

Accordingly, it is an object of some preferred embodiments of the present invention to provide drivers for piezoelectric elements that are reliable, simple and of low cost.

It is an object of some preferred embodiments of the present invention is to provide drivers for piezoelectric elements that operate the piezoelectric elements as actuators or motors bi-directionally with a minimum of components.

It is an object of some preferred embodiments of the invention to provide bi-directional drivers for piezoelectric motors or actuators in which a single high voltage unswitched drive circuit is used for both direction of motion.

It is an object of some preferred embodiments of the present invention to provide bi-directional drivers for piezoelectric motors or actuators in which the direction of motion is changed by switching circuitry located at a low voltage connection of the control circuitry.

It is an object of some preferred embodiments of the present invention to provide drivers for piezoelectric elements that utilize soft switching so as to minimize switching losses and increase the overall efficiency of the piezoelectric driver unit and to improve electromagnetic compatability.

It is an object of some preferred embodiments of the present invention to provide a piezoelectric driver operated from a low DC voltage source without additional complexity.

It is an object of some preferred embodiments of the present invention to provide a discrete bidirectional switching circuit used in conjunction with an AC voltage provided for operating a piezoelectric motor or other AC load.

Some prior art driver circuits for driving piezoelectric motor firm a DC voltage source, integrally, combined switching and inverter circuitry. That is the inverters did the switching of the inverter output to the piezoelectric element's electrodes without any discrete switching circuitry. The present invention separates the inverter and switching portions of the driver circuitry by providing discrete switching circuitry. Surprisingly, the result is a circuit for driving the piezoelectric element bidirectionally of decreased complexity using fewer components and operating more reliably.

In accordance with one aspect of the invention, a driver circuit for driving a piezoelectric type motor comprises an inverter circuit for providing an oscillating voltage to cause a mechanical displacement of a piezoelectric element and a separate switching arrangement for selecting the direction of said displacement. The driver circuit in the invention of this application delivers the driving voltages to the piezoelectric element at the mechanical resonant frequency of said piezoelectric element.

In a preferred embodiment of the invention a discrete switch arrangement includes high frequency switches for selectively applying voltages across said piezoelectric element to cause mechanical displacement of the piezoelectric element in a selected direction or selected directions. In preferred embodiments of the invention, the switches are on a low voltage side of the connection to the piezoelectric element.

There is thus provided, in accordance with a preferred embodiment of the invention, a micromotor comprising:

a piezoelectric element including a common electrode and a plurality of other electrodes formed thereon and including at least a first and a second electrode group, each group including at least one electrode, where the piezoelectric element causes motion in a first direction when a voltage is applied between the first electrode group and the common electrode and wherein the piezoelectric element causes motion in a second direction when a voltage is applied between the second electrode group and the common electrode;

an voltage source that electrifies the common electrode; and at least two switches separately connected between the first and second electrode groups and a low voltage, said switches being activatable to connect one of said first and second electrode groups to the low voltage to cause selective motion in the first or second directions.

Preferably, the low voltage is substantially ground. Preferably, the applied voltage is an AC voltage.

In a preferred embodiment of the invention, where the piezoelectric element comprises a rectangular piezoelectric plate having fist and second faces, the common electrode is formed on the first face and the first and second groups of electrodes are formed on the second face. Preferably, the first and second groups of electrodes each comprises two electrodes situated in opposite quadrants of the second face.

Preferably, the micromotor comprises a motive surface and motion is induced in a surface of a workpiece pressed against the motive surface when the piezoelectric element is electrified as aforesaid.

There is further provided, in accordance with a preferred embodiment of the invention, a micromotor comprising:

an ultrasonically vibrating element; and
a drive circuit comprising:
an oscillating voltage source connected to and electrifying at least one electrode of said ultrasonically vibrating element to cause a mechanical displacement of a portion thereof; and
a discrete switch arrangement attached to at least one additional electrode of said ultrasonically vibrating element to which said oscillating voltage is not connected which switch arrangement selects the direction of said displacement.

Preferably, the ultrasonically vibrating element comprises a piezoelectric element Preferably, the at least one additional electrode comprises a plurality of electrodes applied to a first face of said vibrating element; and the at least one electrode comprises a common electrode applied to a second face of said element. Preferably, the discrete switch arrangement selectively applies voltage between a first group of said plurality of electrodes and said common electrode to cause displacement in a first direction, said first group including at least one electrode. Preferably, the discrete switch arrangement selectively applies voltage between a second group of said plural of electrodes and said common electrode to cause displacement in a second direction, said second group comprising at least one electrode.

In a preferred embodiment of the invention, the discrete switching arrangement comprises a pair of switches connected to apply voltages across said element to drive current through said element, and controls for selectively operating said switches to select the direction of said displacement. Preferably, the switches of said discrete switching arrangement comprise solid state switches, preferably, transistorized switches and most preferably, Mosfet transistors.

In a preferred embodiment of the invention, the discrete switch arrangement comprises:

a first Mosfet connected between a first voltage and said first group of electrodes;

a second Mosfet connected between said first voltage and said second group of electrodes, said common electrode being connected to a second voltage, and a control that selectively operates said Mosfet switches to selectively apply said first voltage to the first electrode group or to said second electrode group.

Preferably, the micromotor includes a source of control voltages selectively applied to the gates of said first and second Mosfet transistors for selectively switching said first or said second Mosfet transistors from the non conducting state to the conducting state.

Preferably, the micromotor includes a pair of diodes, one of which is connected across each said Mosfet transistor. Preferably, the diodes are connected such that they conduct DC current toward the micromotor.

In a preferred embodiment of the invention, the transistor is off, one end of the Mosfet is at a DC voltage equal to the peak of the oscillating voltage and the oscillating voltage is impressed across the Mosfet transistor, such that the voltage across transistor is substantially unipolar.

In a preferred embodiment of the invention, the source comprises an inverter, preferably, a forward-flyback inverter.

Preferably, the forward-flyback inverter comprises:

a magnetic element having a primary winding and a secondary winding, said primary winding being connected between a first inverter voltage and one side of an inverter operating switch, the other side of said inverter operating switch connected to a second inverter voltage so that when said inverter operating switch is in the conductive stage, current flows through said primary and when said inverter operates switch is in a non conductive state substantially no current flows through said primary; and a control voltage source which selectively turns said inverter operating switches switch on or off, the secondary of said magnetic element being connected to said discrete switching arrangement.

Preferably, the inverter operating switches comprise solid state switches, preferably transistorized switches most preferably, Mosfet transistor, and further comprises circuitry that causes said inverter output to resonate at substantially the mechanical resonant frequency of said piezoelectric element.

In a preferred embodiment of the invention, the circuitry that causes said inverter output to resonate at substantially the mechanical resonant frequency of the piezoelectric comprises a capacitor bridging said switch and in series with the pi of the magnetic element, said capacitor operating in conjunction with the capacitance of said ultrasonically vibrating motor to turn said magnetic element to resonate at substantially the mechanical resonant frequency of the motor.

In a preferred embodiment of the invention, the inverter is a push-pull inverter.

Preferably, the push-pull inverter comprises a transformer, having a primary and a secondary;
- a series inductor connecting a first inverter input to a mid part of the primary of said transformer,
- the secondary of said transformer connected to said discrete switching arrangement and one side of the primary of said transformer being connected through a first push-pull inverter switch to a second inverter input,
- the other side of said primary of said transformer being connected through a second push-pull inverter switch to said second input.

Preferably, the fist and second push-pull switches comprise solid states switches, more preferably, transistorized switches and most preferably, Mosfet type switches.

In a prefer embodiment of the invention, the capacitance of said ultrasonic motor and the inductances of the series inductance and of said transformer match the electrical circuit to the mechanical resonance of said piezoelectric element. Preferably, the first or the second push-pull inverter switches are each selectively operated by control voltages, preferably, square wave voltages.

In a preferred embodiment of the invention, the push-pull inverter includes a buck section for controlling the amplitude of the voltage connected to said primary of said transformer. Preferably, the buck section includes:
- a series buck section switch connected between the first input of the inverter and the series inductor;
- a diode connected between an output of the buck section switch and said second input of the inverter and,
- a control voltage operative to cause the buck section switch to conduct.

In a preferred embodiment of the invention, the second input is ground. Preferably, the first input is electrified with a DC voltage.

There is further provided, in accordance with a preferred embodiment of the invention, a method of supplying switchable AC power to a load comprising:
- connecting a fist terminal of an AC power source to one side of the load;
- connected a Mosfet transistor between a second terminal of the AC power source and the other side of the load; and
- selectively supplying power to the load by applying a voltage between a gate of the Mosfet and the second AC terminal.

Preferably a diode is connected across the Mosfet. Preferably, the diode is connected such that it conducts current between the second terminal and the other side of the load.

In a preferred embodiment of the invention a capacitor is placed in series with the load, which preferably, does not include a DC blocking capacitor.

In accordance with a preferred embodiment of the invention, when the transistor is off, one end of the Mosfet is at a DC voltage equal to the peak voltage of the AC source and AC voltage of the AC source is impressed across the Mosfet transistor, such that the voltage across transistor is substantially unipolar.

BRIEF DESCRIPTION OF THE DRAWINGS

The above named and other features and objects of the present invention will be best understood from the following description of preferred embodiments of the invention taken in conjunction with the accompanying drawings, in which.

DETAILED DESCRIPTION OF PREFERRED EMBODIMENTS

Figure 1A:
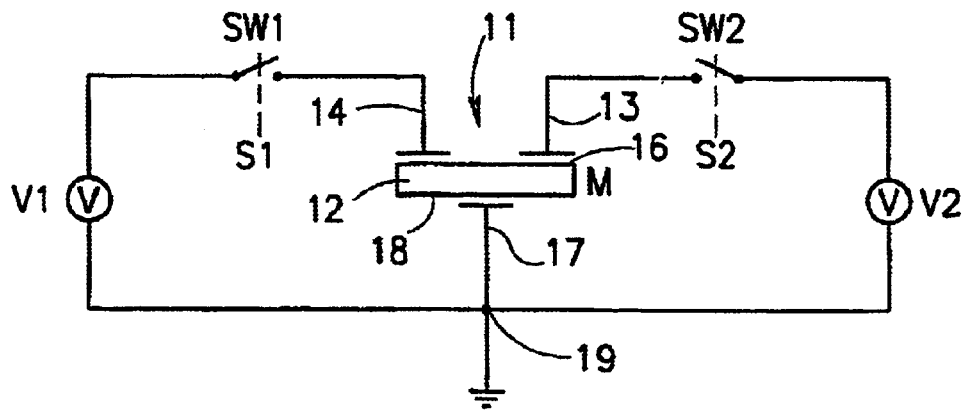
FIGS. 1A and 1B are a simplified schematic showing of a bi-directional piezoelectric motor and associated driver circuitry of the prior art.
Figure 1B:
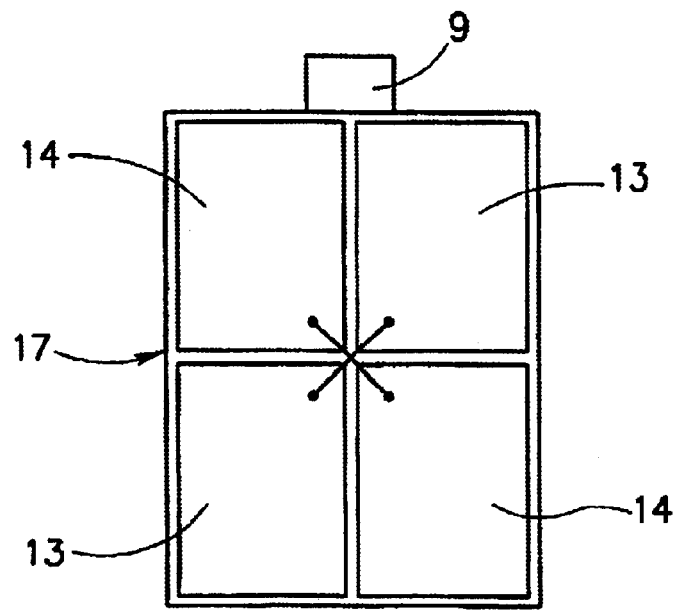

FIGS. 1A and 1B are a simplified schematic showing of a bi-directional piezoelectric motor as used in the prior art to aid in understanding the invention. The piezoelectric motor 11, comprises a piezoelectric crystal or ceramic element 12, that operates responsive to electric voltage thereacross to provide mechanical displacement.

As shown in FIGS. 1A and 1B, to operate the motor bi-directionally, two pairs of electrodes 13 and 14 are attached to a first face 16 of element 12 and a common electrode 17 is attached to and covers substantially all of an opposite face 18 of element 12. Common electrode 17 is grounded at 19. A first AC voltage V1 is applied between electrodes 14 and 17 by the operation of switch SW1 responsive to a control signal S1. Voltage V1 causes mechanical displacement of a surface pressed against an extension 9 of element 12 in a first direction.

Operation of switch SW2, responsive to a control signal S2, applies a second AC voltage V2 between electrodes 13 and 17. Voltage V2 causes mechanical displacement of a surface pressed against extension 9 in a second direction. The piezoelectric element 12 is reactive in nature and mechanically resonates at particular frequencies in transverse directions.

It should be understood that when electrodes are shown, in the following drawings, in the manner of electrodes 13 and 14, what is meant is a configuration such as that shown in FIG. 1B.

Figure 2:
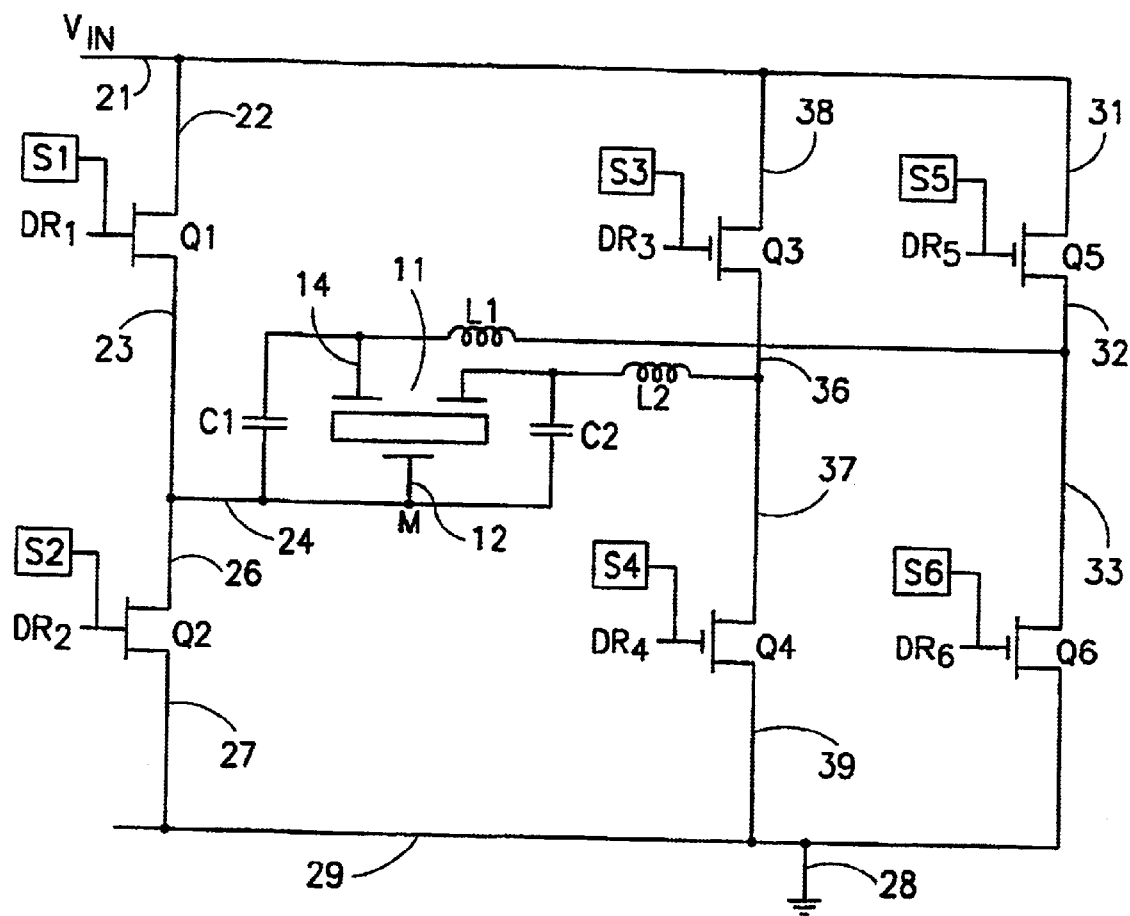
FIG. 2 is prior art bridge circuit implementation of a bi-directional piezoelectric motor driver.

FIG. 2 shows a typical prior art implementation of a bi-directional driver for a piezoelectric motor. A prior art bi-directional inverter driver as shown in FIG. 2 has a positive supply voltage Vin applied to conductor 21. A switch shown as Q1 is connected to conductor 21. The switch is shown as a Mosfet type transistor with the source 22 connected to the conductor 21. The switch Q1 in the preferred embodiment is operated to the conducting state by a pulsed gate control signal S1 applied to gate DR1. Responsive to the gate control signals the switch Q1 applies DC voltage Vin as pulses to the drain 23 of switch Q1. The drain 23 is connected to conductor 24 which connects to common electrode 17 of piezoelectric motor 11. Conductor 24 is connected to ground through switch Q2 operated to the conducting condition in response the pulsed control signal S2 applied on the gate DR2 of switch Q2. The source 26 of switch Q2 is connected to conductor 24 and the drain 27 of switch Q2 is connected to ground 28 through conductor 29.

Electrodes 14 of piezoelectric motor 11 is connected to the junction of a capacitor C1 and an inductor L1. Capacitor C1 and inductor L1 form a resonant circuit tuned to the mechanical resonance frequency of the piezoelectric motor. The other side of capacitor C1 is connected to conductor 24. The other side of inductor L1 is connected through conductor 30 to the junction of another pair of switches, Q5 and Q6. Transistor switches Q5 and Q6 operate to the conductive state responsive to pulsed signals S5 and S6 on the gate drivers shown as DR5 and DR6. The source 31 of switch Q5 is coupled to the DC voltage Vin on conductor 21. The is drain 32 of switch Q5 is coupled to the source 33 of switch Q6. The drain 34 of switch Q6 is coupled is to ground conductor 29.

Another half bridge circuit connects electrodes 13 of the motor 11 to source voltage Vin. More particularly, the electrode 13 of the motor 11 is connected to the junction of inductor L2 and capacitor C2 which form a second resonant circuit. The other side of capacitor C2 is connected to conductor 24. The other side of inductor L2 is connected to the junction of the drain 36 of switch Q3 and the source 37 of switch Q4. The source 38 of switch Q3 is coupled to the DC voltage Vin on conductor 21. The drain 39 of switch Q4 is coupled to the grounded conductor 29. The switches Q2, Q4 are operated responsive to signals S3, S4.

In operation, Q1 and Q2 act together with either Q3 and Q4 or Q5 and Q6 to apply an oscillating voltage to the resonant circuit of L1/C1 or L2/C2 respectively, in a manner well known in the art. Depending on which half bridge is operated together with Q1/Q2, either electrodes 13 or 14 will be energize. This allows for reversible motion of a surface pressed against extension 9.

In greater detail when switches Q1, Q2 and Q5, Q6 are operated, an AC voltage is applied between electrodes 14 and 17 of the motor 11 at the resonant frequency set by capacitor C1 and inductor L1. Alternatively, an AC voltage is applied between electrodes 13 and 17 by the operation of switches Q1, Q2 and Q3, Q4. This applies an AC voltage across electrodes 13 and 17 at the resonant frequency set by inductor L2 and capacitor C2. Thus, the voltage across electrodes 13 and 17 responsive to the operation of switches Q1–Q4 cause the motor to operate in one direction and the operation of switches Q1, Q2 and Q5, Q6 cause the motor to operate in the opposite direction. This typical prior art circuitry requires two high Q resonant circuits, C1, L1 and C2, L2 and six switching components operated responsive to signals S1–S6 applied to the gates DR1–DR6.

A high voltage Vin is needed across the motor if reasonable Q factors are to be used. For example, a Q factor of 5 requires the input voltage to be about ⅕ of the required motor voltage. A motor voltage of 400 volts is reasonable. This implies that the input voltage needs to be 80 volts. If lower voltages are required then additional circuitry would have to be added.

Figure 3:
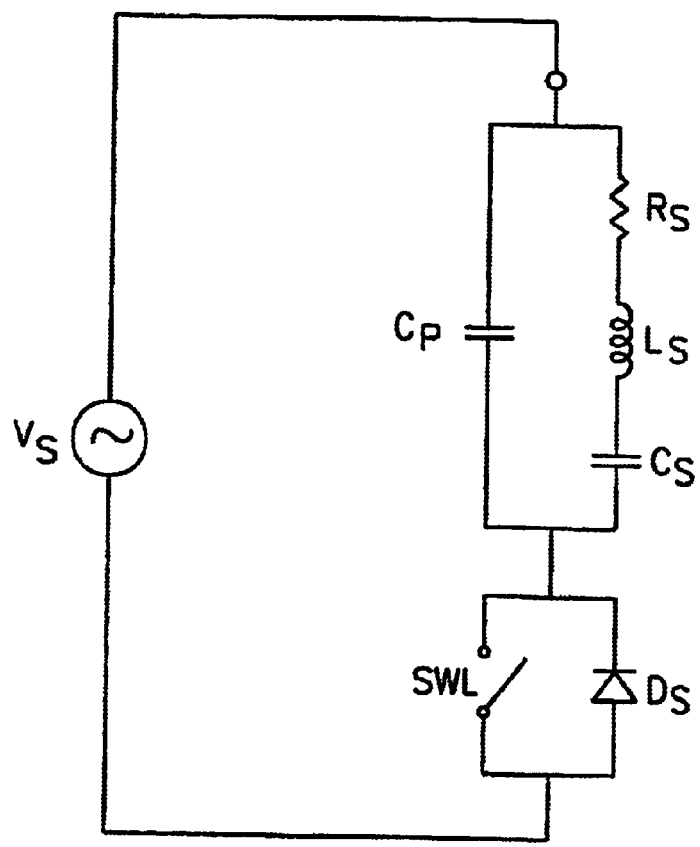
FIG. 3 is a basic electrical component schematic showing of an AC switch operating a piezoelectric motor.

FIG. 3 shows an AC switch and equivalent circuit of the piezoelectric device, respectively, useful in understanding preferred embodiments of the invention.

In FIG. 3, $L_s/C_s$ represent the mechanical resonance of the piezoelectric devise $R_s$ represents mechanical work and losses and $C_p$ is the electrode capacitance. Since $C_p$ is very large, an inductor is usually added in series with the piezoelectric device.

When switch SWL is closed, $V_s$ is applied to the piezoelectric device and the motor operates. When SWL is open, capacitor $C_p$ is clamped to the peak value of Vs via diode $D_s$. This DC voltage is maintained so long as SWL is open. In this situation, (DC voltage across the piezoelectric element) the motor does not operate. AC Voltage appears across the diode.

Figure 4:
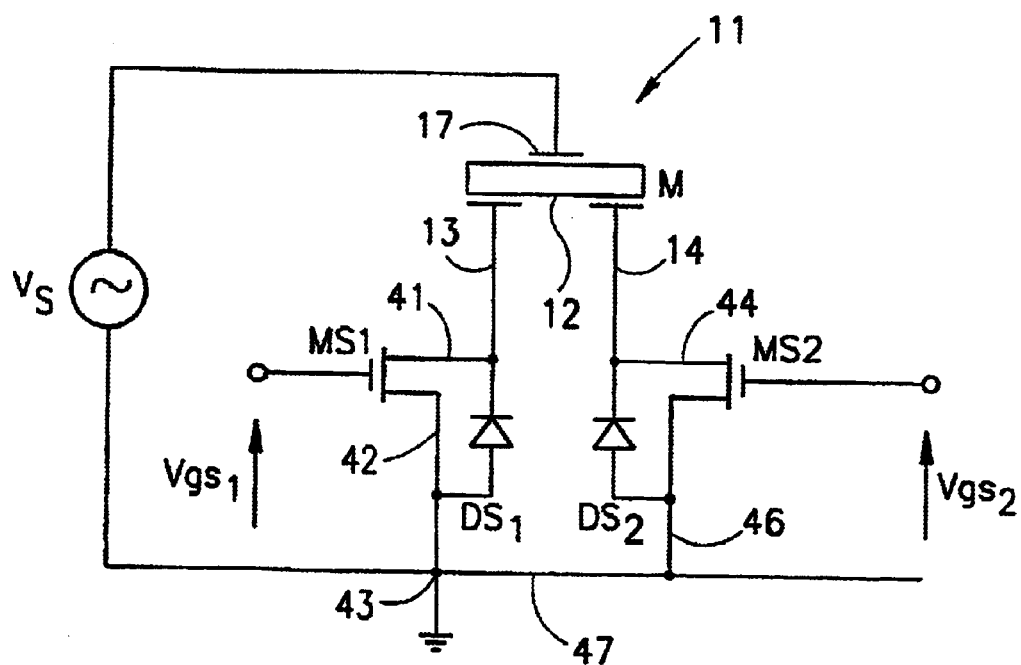
FIG. 4 is a schematic showing of a discrete bi-directional switch used with a piezoelectric motor.

FIG. 4 shows a preferred embodiment of the discrete bidirectional AC switch for operating with an AC voltage $V_s$ to drive piezoelectric motor 11. As in FIG. 1, piezoelectric motor 11 comprises electrodes 13, 14 on one face and electrode 17 on the opposite face of piezoelectric element 12. While any solid state switching units can be used, in a preferred embodiment there two Mosfet switches $M_{S1}$ and $M_{S2}$, each connected to electrodes 13 and 14 respectively are used as the switches. Diodes $D_{S1}$ and $D_{S2}$ shown as connected across the switches $M_{S1}$ and $M_{S2}$ are inherent in Mosfet transistors. Source 41 of switch $M_{S1}$ and diode $D_{S1}$ are both connected to electrodes 13 of motor 11. Drain 42 of switch $M_{S1}$ and the other side of diode $D_{S1}$ are shown as being grounded at 43. Source 44 of switch $M_{S2}$ is connected to the anode of diode $D_{S2}$ and to electrodes 14. Drain 46 of switch $M_{S2}$ is connected ground 43 through conductor 47. One side of the alternating voltage source is connected to the common electrode 17 of the piezoelectric motor 11 while the other side of the voltage source is coupled to ground through conductor 47. The operating direction of the piezoelectric motor 11 is controlled by gate voltages $V_{gs1}$ and $V_{gs2}$ applied to the gates of switches $M_{S1}$ and $M_{S2}$ respectively. When $M_{S1}$ is closed (and $M_{S2}$ is open), the AC voltage is applied between electrodes 17 and 13 and a surface pressed against extension 9 moves in a first direction. When $M_{S2}$ is closed an $M_{S1}$ is open, travel is in the reverse direction.

This is facilitated by the fact that when $M_{S2}$ is open, it disconnects the AC current path (the AC voltage appears across the switch) from electrode 14. The DC voltage that develops, under these conditions, between electrodes 14 and 11 does not interfere with the operation of the motor, as effected by the AC voltage between electrodes 17 and 13.

Major advantages of this bidirectional switching configuration is that:

a) the control voltages are all referred to ground, and b) only one AC source is required.

One reason these advantages are available is that unlike the prior art drivers, the common electrode is not referenced to ground, Rather, one of the electrode pairs 13 or 14 is grounded. This allows for a single power source to feed the common electrode and, since the individual electrodes are near ground, for the switching to be controlled with low voltages.

This switching scheme can be incorporated in conjunction with any inverter driver but it has special merits when the inverter configuration of this invention is used to provide the driving voltage $V_s$.

Figure 5:
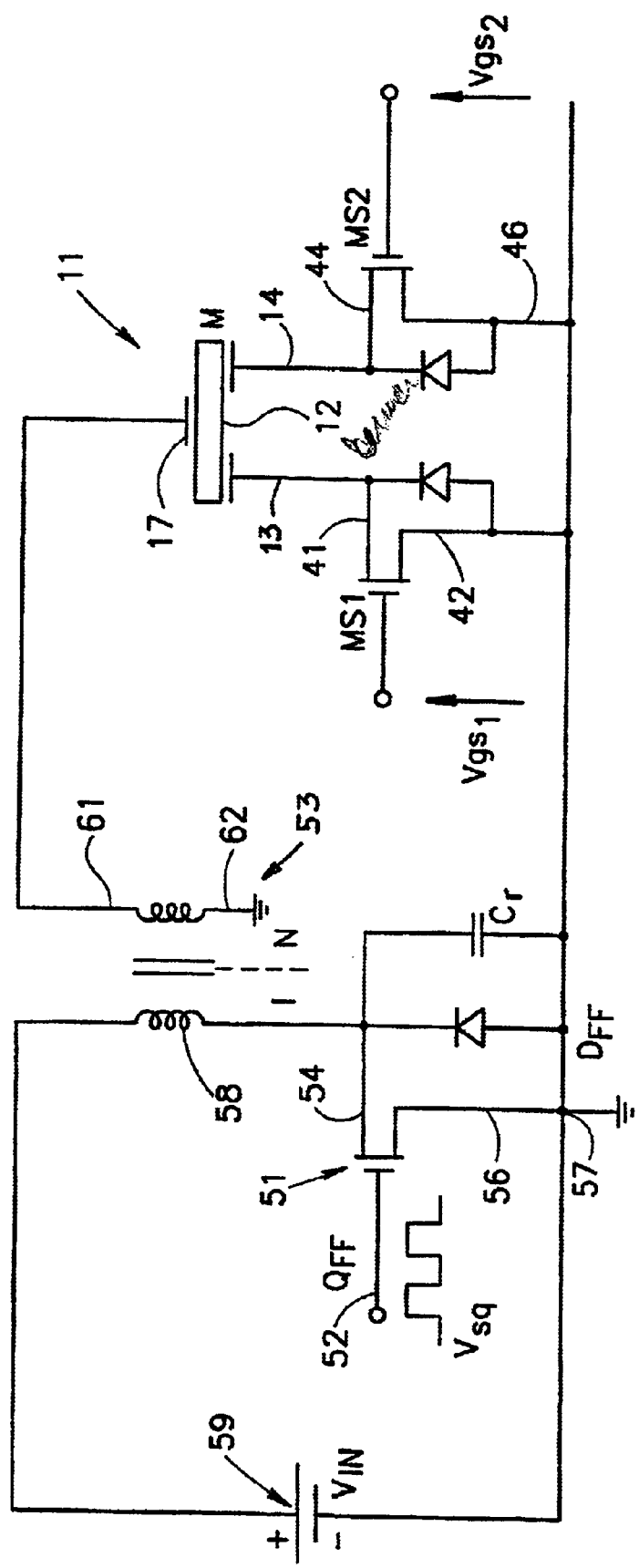
FIG. 5 is a schematic showing of a preferred driver circuit comprising a forward-flyback inverter used in conjunction with the bi-directional switch for operating the piezoelectric motor.

A preferred embodiment of the AC source is a forward-flyback type inverter such as schematically shown in FIG. 5. Therein a high frequency switch such as Mosfet transistor $Q_{ff}$ 51 is driven by square wave signal $V_{sg}$ applied to the gate electrode 52. Source 54 of switch $Q_{ff}$ is connected to a primary winding 58 of a two winding magnetic element indicated at 53. Drain 56 of switch $Q_{ff}$ is coupled to ground 57. While many types of switches can be used at $Q_{ff}$, the preferred embodiment encompasses a Mosfet type transistor. The diode inherent in the Mosfet transistor is shown as $D_{ff}$ coupled from drain 56 to source 54 of transistor $Q_{ff}$. The other side of the primary winding 58 of the magnetic element 53 is connected to positive DC voltage Vin as shown at 59. The switch $Q_{ff}$ is bridged by a capacitance $C_r$ connected between its source 54 and drain, 56. Capacitance $C_r$ forms a resonant circuit with the other reactive components.

The inverter is preferably connected to piezoelectric element 12 and the pair of discrete bidirectional switches through the secondary winding 61 of the two winding magnetic element 53. The turns ratio between the primary winding 58 and the secondary winding 61 is shown as being 1:n where n in one preferred embodiment is in a range between 2 and 25.

One side of winding 61 is preferably connected to ground at 62. The other side is connected to the common electrode 17 of the motor 11. The other electrodes of the motor 11, i.e. electrode pairs 13 and 14 are connected to high frequency switches such as switches $M_{S1}$ and $M_{S2}$, in the manner described above with respect to FIG. 4.

Figure 6:
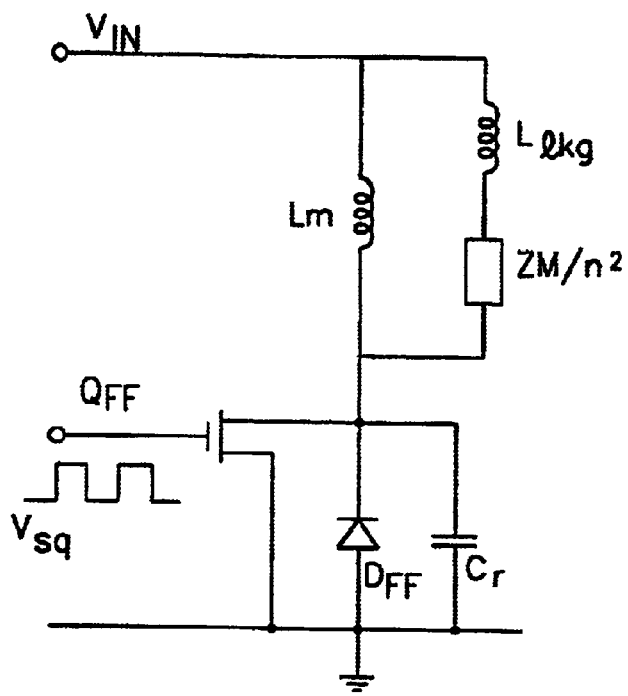
FIG. 6 is an equivalent circuit of FIG. 5 showing elements of the secondary circuitry reflected to the primary.

The operation of the combination of the discrete inverter and the discrete bi-directional switch, in combination, is more clearly dd with reference to the schematic of FIG. 6. That schematic shows one of the switches open and the other closed with all secondary components (including the closed lines) being reflected to the primary. The inductance of the two element magnetic unit 53 is shown as $L_{lkg}$, i.e. the leakage inductance of the magnetic element 53. The piezoelectric element 12 of the motor 11 is represented by the impedance $Z_M$ which is mainly capacitive in the name at the mechanical resonance frequency. It is shown as being divided by $n^2$ when reflected into the primary of magnetic unit 53.

A square wave voltage $V_{sq}$ is shown applied to the gate of switch $Q_{ff}$ whose drain is connected ground and whose source is connected to inductor $L_m$ and to motor (impedance) element $Z_M$. Diode $D_{ff}$ is Anon as is resonance capacitance $C_r$, both bridging switch $Q_{ff}$. Capacitance Cr is in series with and resonates with the inductance $L_m$ bridged by the leakage inductance $L_{lkg}$ in series with the reactance $Z_M/n^2$.

While a square wave operating voltage $V_{sg}$ is shown; it should be understood that the operating voltage can assume other forms as known in the art within the scope of the invention.

Figure 7:
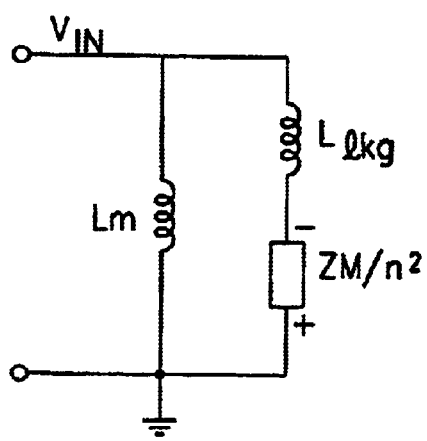
FIG. 7 is the schematic showing of the circuit of FIG. 6 when the switch Qff is conducting.
Figure 8:
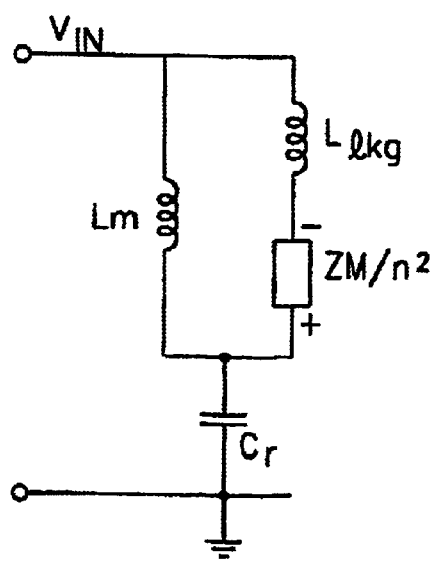
FIG. 8 is a schematic showing of the circuit of FIG. 6 when the switch $Q_{ff}$ is non-conducting.

When the switch $Q_{ff}$ is conducting, as shown in FIG. 7, energy is delivered to the motor in a resonant manner in the two half cycles. When the high frequency switch $Q_{ff}$ is conducting, energy is transferred from the voltage source to the motor and energy is also stored in inductance $L_m$. A resonance circuit is formed between the leakage inductor $L_{kj}$ and the motor impedance $Z_m$. Hence the voltage wave form fed to the motor is sinusoidal. During a non conducting period of the switch $Q_{ff}$, as shown is FIG. 8, the energy stored in the inductance $L_m$ is transferred to the motor. Notice that the voltage to the motor now is of opposite polarity than the voltage that was applied during the conducting stage of switch $Q_{ff}$. Reactive element $L_m$, bridged by the series connection of $L_{kg}$ and $Z_m/n^2$ forms a resonant circuit that can shape the voltage across the motor to be sinusoidal by properly choosing the circuit parameters. Preferably, this circuit is resonant at the mechanical resonance frequency.

Note that when the wave form across the switch is sinusoidal the switch operates under "soft" switching conditions. In other words if switch $Q_{ff}$ turns off after voltage across it reduces to zero, the switch is turned on under zero voltage conditions. Then, when the switch $Q_{ff}$ is turned off, the voltage will rise across it relatively slowly due to the action of capacitor $C_r$. Hence zero voltage switching at turn off is achieved.

Thus the circuit of FIG. 5, according to this preferred embodiment of the invention, may have one or more of a number of advantages, for example:

i) a single switch is used for implementing the inverter section, ii) all signal drives are referred to one ground, iii) by choosing the proper turns ratio the motor voltage can be made high even if $V_{in}$ is a low DC voltage, iv) the motor signals are of low harmonic content, and in addition v) the total part count is very low, i.e. the inverter section is based on a single transistor and the discrete bidirectional switch has only two transistor.

Further the embodiment of FIG. 5 is suitable for relatively low power levels.

As can be well understood, the act design details for such circuitry is a function of the exact physical and electrical parameters. However, the design can be optimized for the particular characteristics of piezoelectric element utilizing design programs such as SPICE or the like. Once such a design is achieved, the components (including the non-ideal transformers used in the designs) may be designed and produced using methods well known in the art or magnetic component design.

Figure 9:
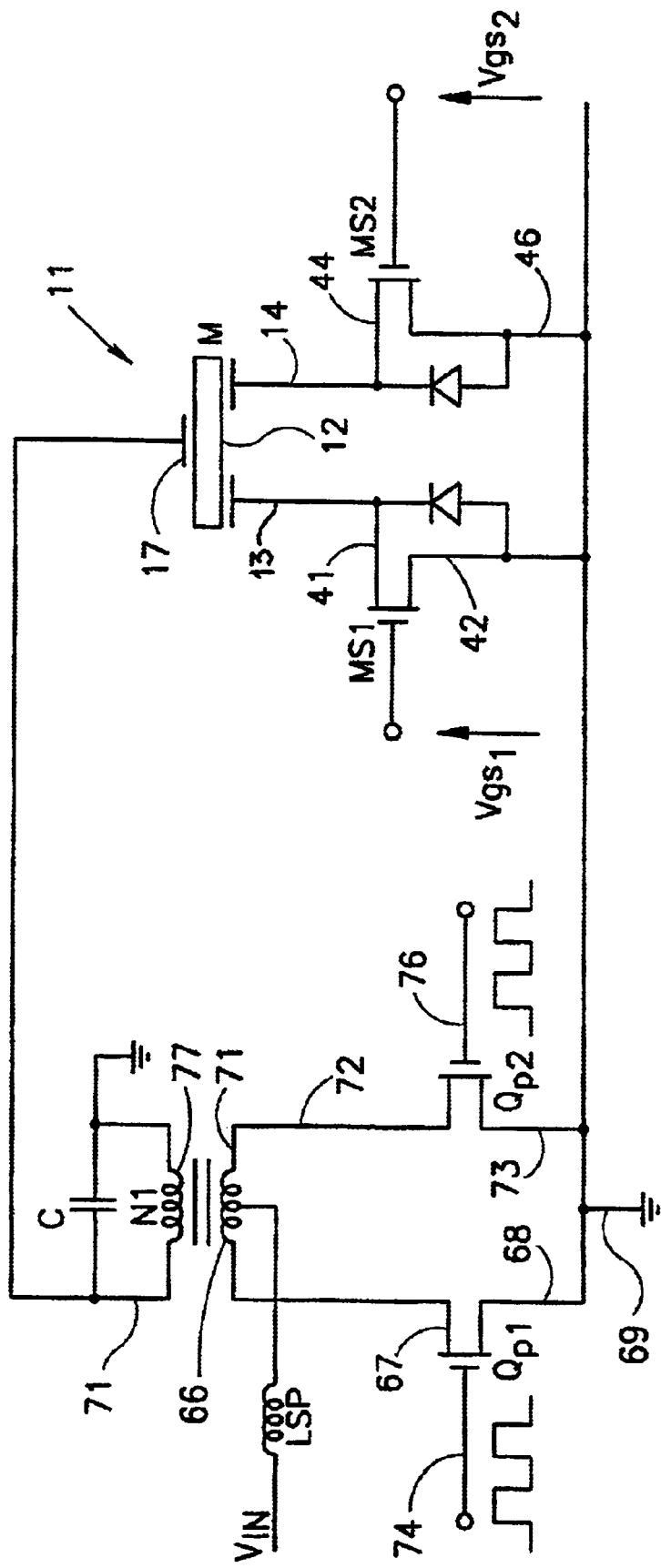
FIG. 9 is a schematic showing of a preferred driver circuit comprising a push-pull parallel resonant inverter used in conjunction with the bi-directional switch for operating the piezoelectric motor.

Another preferred embodiment of the invention is shown in FIG. 9, in which the discrete inverter is of a push-pull configuration. The push-pull configuration is suitable for higher power levels then is the forward flyback inverter. In the push-pull arrangement of the inverter shown in FIG. 9, two switches $Q_{p1}$ and $Q_{p2}$ operate on the load in a push-pull manner through a resonant network. The resonant network comprises the inductance of a transform TR whose secondary is bridged by capacitor $C_{pp}$. Current from the DC voltage $V_{in}$ is applied to primary 66 of transformer TR through series inductor $L_{sp}$. The input to the transformer is to the middle of the primary windings 66 as shown in FIG. 9. In a preferred embodiment of the invention, the two switches $Q_{p1}$ and $Q_{p2}$ are Mosfet transistors.

One side of primary 66, goes to the source 67 of transistor $Q_{p1}$. Drain 68 of transistor $Q_{p1}$ is coupled to ground at 69. The other side of the Primary wing 66 of transformer TR is coupled to source 72 of switch Q. Drain 73 of transistor switch $Q_{p2}$ is coupled to ground. Both transistors $Q_{p1}$ and $Q_{p2}$ are shown as having square wave control voltages applied to their gates 74 and 76 respectively, for converting the DC voltage input to an AC voltage at the resonant frequency. Control voltages with other waveforms could be used within the scope of the invention. The secondary winding n1 of transformer TR, has one side 77 connected to ground and the other side 78 connected to common electrode 17 of motor 11. When the parameters of the circuit are properly chosen the signal fed to the motor 11 will be of a sinusoidal shape with low harmonic distortion.

Figure 11:
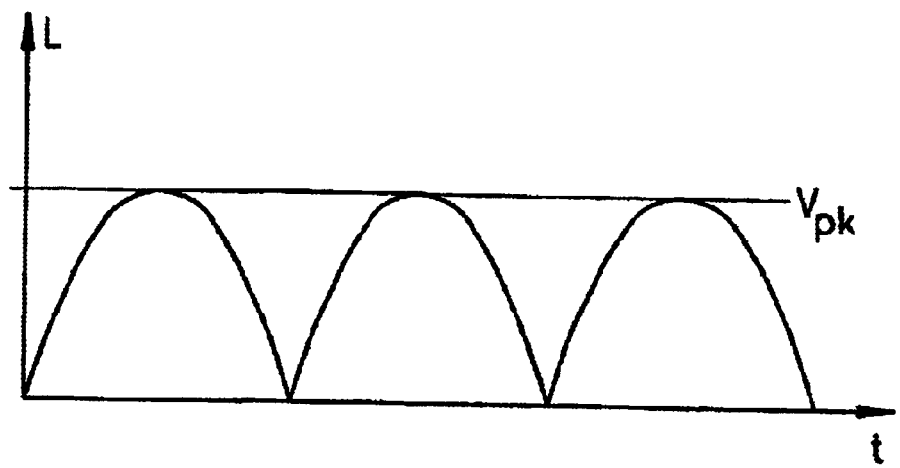
FIG. 11 is a showing of the voltage wave form at point A of FIG. 10.

The major benefit of the push-pull embodiment over the forward-flyback embodiment is the capability to handle higher power levels. Furthermore, by slight modification, the output of voltage of the push-pull embodiment can be firer controlled as is illustrated in FIG. 11. Here an additional high frequency switch $Q_{buck}$ and diode $D_{buck}$ have been added. These elements together with inductor $L_{sp}$ form a "down" or "buck" inverter. This type of inverter is controlled by the duty cycle $D_{on}$ of $Q_{buck}$. Assuming a sinusoidal wave form, the voltage at point "A" in FIG. 11 will be as shown in FIG. 12. The peak value $V_{pk}$ of this wave form will be related to the motor voltage by the equation:

$$V_{PK}=V_{motor}/n.$$

Figure 10:
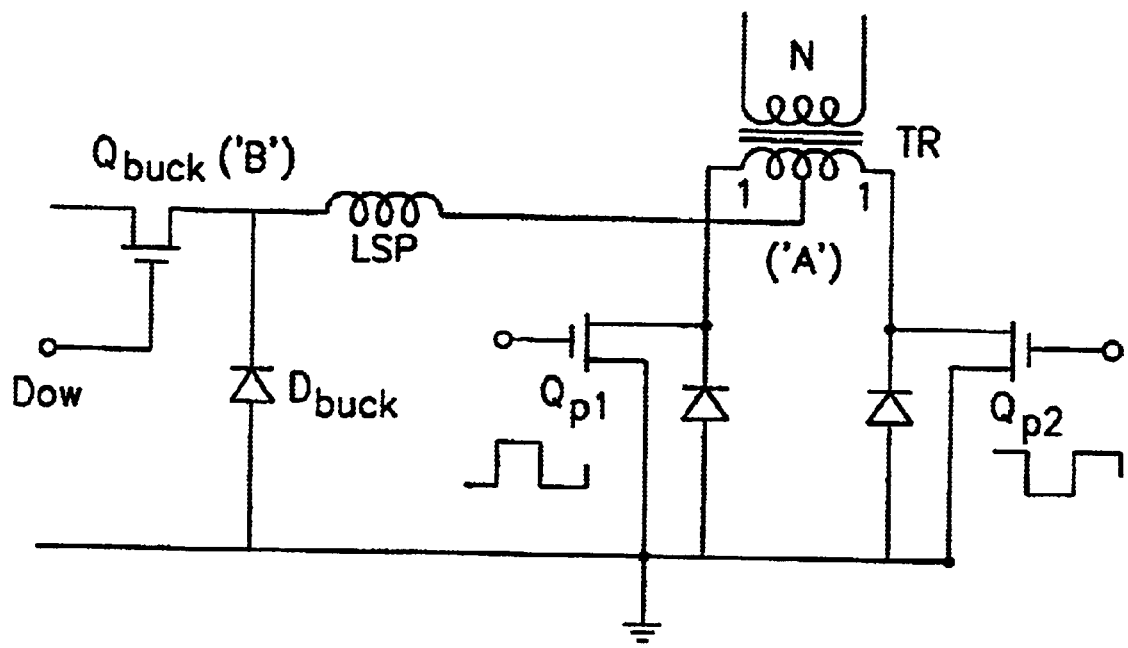
FIG. 10 is a schematic showing of the push-pull inverter of FIG. 9 including a buck section providing output voltage control.

At steady state, the average voltage across the inductor $L_{sp}$ will be zero and hence the average of $V_{pk}$ must be equal to the voltage at point "B" in FIG. 10 which is equal to $V_{in}*D_{on}$. Hence:

$$V_{PK}=nV_{in}*D_{on}.$$

Consequently from these equations:

$$V_{motor}=n*V_{in}*D_{on}.$$

Hence the motor voltage can be controlled by varying $D_{on}$ of $Q_{buck}$. This feature is particularly applicable when variable motor voltages, are called for such as for varying the speed of the motor.

The preferred embodiments have been desired in relation to a piezoelectric motor having a common electrode on one face of a piezoelectric ceramic and two pairs of electrodes on the other face. However, the motor may also operate more of fewer electrodes and with different configuration. Further it can be adapted to other configurations of piezoelectric motors.

Furthermore, a bipolar switch in accordance a preferred embodiment of the invention may be used for various other applications. In fact many AC loads may be switched such a bipolar switch. In general, it is difficult to switch an AC load with a single MOS transistor. In accordance with a preferred embodiment of the invention, a switch, such as one half of the circuit shown in FIG. 4, may be used to switch a capacitive AC load, using a single transistor. Furthermore, if the load is not capacitive a large (compared to the admittance of the load) capacitor may be placed in series with the load. For AC purposes (i.e., when the switch is closed) the capacitor has negligible effect. However, when the switch is open, the voltage across the capacitor will rise to the peak of the AC voltage switching the load of, as described above.

Various modifications will be apparent to and will be readily available to those skilled in the art without departing from the scope and spirit of the invention. Accordingly it is not intended that the scope of the claims appended hereto be limited to the description as set forth herein but rather that the claims be broadly constructed. It should be understood that the verbs "comprise" and "include" and their conjugations, when used in the claims, mean "including, but not necessarily limited to."

What is claimed is:

1. A micromotor comprising:
   an ultrasonically vibrating element; and
   a drive circuit comprising:
      an oscillating voltage source having a high voltage side connected to and electrifying at least one electrode of said ultrasonically vibrating element to cause a mechanical displacement of a portion thereof; and
      a discrete switch arrangement attached to at least one additional electrode of said ultrasonically vibrating element to which said oscillating voltage is not connected which switch arrangement selects the direction of said displacement.

2. A micromotor according to claim 1 wherein the ultrasonically vibrating element comprises a piezoelectric element.

3. A micromotor according to claim 1, wherein:
   the at least one additional electrode comprises a plurality of electrodes applied to a first face of said vibrating element; and
   the at least one electrode comprises a common electrode applied to a second face of said element.

4. A micromotor according to claim 3 wherein the discrete switch arrangement selectively applies voltage between a first group of said plurality of electrodes and said common electrode to cause displacement in a first direction, said first group including at least one electrode.

5. A micromotor according to claim 4, wherein the discrete switch arrangement selectively applies voltage between a second group of said plurality of electrodes and said common electrode to cause displacement in a second direction, said second group comprising at least one electrode.

6. A micromotor according to claim 5 wherein said discrete switch arrangement comprises:
   a first Mosfet connected between a first voltage and said first group of electrodes;
   a second Mosfet connected between said first voltage and said second group of electrodes, said common electrode being connected to a second voltage, and
   a control that selectively operates said Mosfet switches to selectively apply said first voltage to the first electrode group or to said second electrode group.

7. A micromotor according to claim 6 including a source of control voltages selectively applied to the gates of said first and second Mosfet transistors for selectively switching said first or said second Mosfet transistors from the non conducting state to the conducting state.

8. A micromotor according to claim 6 and including a pair of diodes, one of which is connected across each said Mosfet transistor.

9. A micromotor according to claim 8 wherein the diodes are connected such that they conduct DC current toward the micromotor.

10. A micromotor according to claim 7 wherein, when the transistor is off, one end of the Mosfet is at a DC votage equal to the peak of the oscillating voltage and the oscillating voltage is impressed across the Mosfet transistor, such that the voltage across the transistor is substantially unipolar.

11. A method of supplying switchable AC power to a micromotor comprising:
   connecting a first terminal of an AC power source to one side of the micromotor;
   connected a drain of a Mosfet transistor to a second terminal of the AC power source;
   connecting a source of the Mosfet transistor to the other side of the micromotor and
   selectively supplying power to the load by applying a voltage between a gate of the Mosfet and the second AC terminal.

12. A method according to claim 11 and including connecting a diode across the Mosfet transistor.

13. A method according to claim 12 wherein the diode is connected such that it conducts current between the second terminal and the other side of the load.

14. A method according to claim 11 and including placing a capacitor in series with the load.

15. A method according to claim 14 wherein the load does not comprise a DC blocking capacitor.

16. A method according to claim 11 wherein, when the transistor is off, one end of the Mosfet is at a DC voltage equal to th peak voltage of the AC source and AC voltage of the AC source is impressed across the Mosfet transistor, such that the voltage across transistor is substantially unipolar.

17. A micromotor according to claim 1 wherein fewer than four switches are provided for selectively controlling at least two directions of said displacement.

18. A micrometer according to claim 17 wherein said fewer than four discrete switches are a single discrete switch per direction of displacement.

19. A micromotor comprising:

an ultrasonically vibrating element; and a drive circuit comprising:

an oscillating voltage source having a high voltage side connected to and electrifying at least one electrode of said ultrasonically vibrating element to cause a mechanical displacement of a portion thereof; and a discrete switch arrangement not connected to the high voltage side of the voltage source and attached to at least one electrode of said ultrasonically vibrating element, which switch arrangement selects the direction of said displacement.

20. A micromotor comprising:

an ultrasonically vibrating element; and a drive circuit comprising:

an oscillating voltage source having a high voltage side connected to and electrifying at least one electrode of said ultrasonically vibrating element to cause a mechanical displacement of a portion thereof; and a discrete switch arrangement attached to at least one additional electrode of said vibrating element that elects the direction of said displacement without switching the high voltage side of the voltage source to or from the at least one additional electrode.

* * * * *

UNITED STATES PATENT AND TRADEMARK OFFICE
CERTIFICATE OF CORRECTION

PATENT NO. : 6,747,391 B1
DATED : June 8, 2004
INVENTOR(S) : Shmuel Ben-Yaakov

It is certified that error appears in the above-identified patent and that said Letters Patent is hereby corrected as shown below:

<u>Title page,</u>
Item [56], References Cited, OTHER PUBLICATIONS,
"Ivensky, G. et al" reference, first occurrence, change "Bed" to -- Fed --
"Ivensky, G. et al" reference, second occurrence, change "Fad" to -- Fed --
"Edry, D. et al." reference, change "SPIC" to -- SPICE --
"Ben-Yaakov, S. et al." reference, change "Conferen" to -- Conference --

Signed and Sealed this

Eighth Day of February, 2005

JON W. DUDAS
*Director of the United States Patent and Trademark Office*